(12) United States Patent
Wang et al.

(10) Patent No.: US 11,250,750 B2
(45) Date of Patent: Feb. 15, 2022

(54) SHIFT REGISTER CIRCUIT, AND DRIVING METHOD THEREOF, GATE DRIVE CIRCUIT AND DISPLAY DEVICE

(71) Applicant: BOE Technology Group Co., Ltd., Beijing (CN)

(72) Inventors: Zhichong Wang, Beijing (CN); Haoliang Zheng, Beijing (CN); Seungwoo Han, Beijing (CN); Guangliang Shang, Beijing (CN); Mingfu Han, Beijing (CN); Lijun Yuan, Beijing (CN); Xing Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 160 days.

(21) Appl. No.: 16/126,032

(22) Filed: Sep. 10, 2018

(65) Prior Publication Data

US 2019/0139475 A1  May 9, 2019

(30) Foreign Application Priority Data

Nov. 9, 2017  (CN) .......................... 201711108474.8

(51) Int. Cl.
| | |
|---|---|
| *G11C 19/00* | (2006.01) |
| *G09G 3/20* | (2006.01) |
| *G11C 19/28* | (2006.01) |
| *G09G 3/3266* | (2016.01) |
| *G11C 7/02* | (2006.01) |
| *G09G 3/36* | (2006.01) |

(52) U.S. Cl.
CPC ............. *G09G 3/20* (2013.01); *G09G 3/3266* (2013.01); *G09G 3/3674* (2013.01); *G11C 7/02* (2013.01); *G11C 19/28* (2013.01); *G09G 2310/0267* (2013.01); *G09G 2310/0286* (2013.01); *G09G 2310/061* (2013.01)

(58) Field of Classification Search
None
See application file for complete search history.

(56) References Cited

U.S. PATENT DOCUMENTS

| | | | | |
|---|---|---|---|---|
| 4,623,908 | A * | 11/1986 | Oshima ................. | G02F 1/1368 257/66 |
| 9,396,682 | B2 * | 7/2016 | Xia ...................... | G09G 3/3266 |
| 9,792,851 | B2 * | 10/2017 | Lou ...................... | G09G 3/2096 |

(Continued)

*Primary Examiner* — Tuan T Lam
(74) *Attorney, Agent, or Firm* — Fay Sharpe LLP

(57) ABSTRACT

A shift register circuit, a driving method thereof, a gate drive circuit and a display device are provided. The shift register circuit includes an input sub-circuit, an output sub-circuit, a discharge sub-circuit and a noise reduction sub-circuit. The input sub-circuit is connected to an input signal terminal, a first power source terminal and a pull-down node, and configured to, under the control of an input signal, output a first power source terminal signal to the pull-down node. In the shift register circuit, the discharge sub-circuit may control the potential of the pull-down node to be an ineffective potential at the input stage, thereby preventing the noise reduction sub-circuit from affecting the potentials of the pull-up node and the output terminal under the control of the pull-down node, and ensuring normal output of the shift register circuit.

14 Claims, 12 Drawing Sheets

(56) References Cited

U.S. PATENT DOCUMENTS

| | | | | |
|---|---|---|---|---|
| 9,881,572 B2* | 1/2018 | Huang | ............... | G09G 3/3648 |
| 2006/0125518 A1* | 6/2006 | Morosawa | ............ | G11C 19/00 |
| | | | | 326/38 |
| 2006/0220587 A1* | 10/2006 | Tobita | ................ | G11C 19/184 |
| | | | | 315/194 |
| 2006/0269038 A1* | 11/2006 | Jang | .................... | G11C 19/287 |
| | | | | 377/64 |
| 2007/0248204 A1* | 10/2007 | Tobita | .................. | G11C 19/28 |
| | | | | 377/64 |
| 2007/0274433 A1* | 11/2007 | Tobita | ................ | G09G 3/3677 |
| | | | | 377/64 |
| 2008/0101529 A1* | 5/2008 | Tobita | .................. | G11C 19/28 |
| | | | | 377/64 |
| 2008/0187089 A1* | 8/2008 | Miyayama | ............ | G11C 19/28 |
| | | | | 377/79 |
| 2008/0219401 A1* | 9/2008 | Tobita | .................. | G11C 19/28 |
| | | | | 377/79 |
| 2010/0177082 A1* | 7/2010 | Joo | ..................... | G09G 3/3677 |
| | | | | 345/211 |
| 2011/0222645 A1* | 9/2011 | Tobita | ................ | G09G 3/3677 |
| | | | | 377/78 |
| 2011/0228893 A1* | 9/2011 | Tobita | ................ | G11C 19/184 |
| | | | | 377/77 |
| 2011/0291712 A1* | 12/2011 | Tobita | ................ | G09G 3/3677 |
| | | | | 327/144 |
| 2014/0064439 A1* | 3/2014 | Qing | .................... | G11C 19/28 |
| | | | | 377/75 |
| 2014/0093028 A1* | 4/2014 | Wu | ....................... | G11C 19/28 |
| | | | | 377/64 |
| 2014/0354655 A1* | 12/2014 | Kim | ......................... | G06T 1/20 |
| | | | | 345/501 |
| 2015/0317954 A1* | 11/2015 | Jang | ........................ | G09G 3/20 |
| | | | | 345/213 |
| 2016/0267854 A1* | 9/2016 | Kim | .................... | G09G 3/3466 |

\* cited by examiner

SHIFT REGISTER CIRCUIT, AND DRIVING METHOD THEREOF, GATE DRIVE CIRCUIT AND DISPLAY DEVICE

This application claims priority to Chinese Patent Application No. 201711108474.8, filed on Nov. 9, 2017 and titled "SHIFT REGISTER CIRCUIT, AND DRIVING METHOD THEREOF, GATE DRIVE CIRCUIT AND DISPLAY DEVICE", the entire contents of which are incorporated herein by reference.

TECHNICAL FIELD

The present disclosure relates to a shift register circuit, and a driving method thereof, a gate drive circuit and a display device.

BACKGROUND

A shift register generally includes a plurality of cascaded shift register circuits. Each shift register circuit is formed by various circuit parts constituted by switch devices, such as transistors and the like, and is configured to drive a row of pixel circuits in a display device. The plurality of cascaded shift register circuits scan and drive various rows of pixel circuits in the display device row by row, to display images.

SUMMARY

The present disclosure provides a shift register circuit, a drive method, a gate drive circuit and a display device.

In an aspect, there is provided a shift register circuit, comprising: an input sub-circuit, an output sub-circuit, a discharge sub-circuit and a noise reduction sub-circuit; wherein the input sub-circuit is connected to an input signal terminal, a first control signal terminal and a pull-up node respectively, and configured to, under the control of an input signal from the input signal terminal, output a first control signal from the first control signal terminal to the pull-up node; the output sub-circuit is connected to a clock signal terminal, the pull-up node and an output terminal respectively, and configured to, under the control of the pull-up node, output a clock signal from the clock signal terminal to the output terminal; the discharge sub-circuit is connected to the input signal terminal, a first power source terminal and a pull-down node respectively, and configured to, under the control of the input signal, output a first power source signal from the first power source terminal to the pull-down node; and the noise reduction sub-circuit is connected to the pull-down node, the first power source terminal, the pull-up node and the output terminal respectively, and configured to, under the control of the pull-down node, output the first power source signal to the pull-up node and the output terminal respectively.

Optionally, the discharge sub-circuit comprises: a first transistor; wherein a gate of the first transistor is connected to the input signal terminal, a first electrode of the first transistor is connected to the first power source terminal, and a second electrode of the first transistor is connected to the pull-down node.

Optionally, the shift register circuit further comprises: a reset sub-circuit; wherein the reset sub-circuit is connected to a reset signal terminal, a second control signal terminal and the pull-up node respectively, and configured to, under the control of a reset signal from the reset signal terminal, output a second control signal from the second control signal terminal to the pull-up node, wherein a potential of the second control signal is a second potential; and the discharge sub-circuit is further connected to the reset signal terminal, and the discharge sub-circuit is further configured to, under the control of the reset signal, output the first power source signal to the pull-down node.

Optionally, the discharge sub-circuit comprises: a first transistor and a second transistor; wherein a gate of the first transistor is connected to the input signal terminal, a first electrode of the first transistor is connected to the first power source terminal, and a second electrode of the first transistor is connected to the pull-down node; and a gate of the second transistor is connected to the reset signal terminal, a first electrode of the second transistor is connected to the first power source terminal, and a second electrode of the second transistor is connected to the pull-down node.

Optionally, the shift register circuit further comprises: a first pull-down control sub-circuit and a second pull-down sub-circuit; wherein the first pull-down control sub-circuit is connected to the pull-down node and a second power source terminal, and configured to, under the control of a second power source signal from the second power source terminal, output the second power source signal to the pull-down node, wherein a potential of the second power source signal is a first potential; and the second pull-down control sub-circuit is connected to the pull-up node, the pull-down node and the first power source terminal respectively, and configured to, under the control of the pull-up node, output the first power source signal from the first power source terminal to the pull-down node.

Optionally, the input sub-circuit comprises: a third transistor and a fourth transistor; wherein a gate of the third transistor is connected to the input signal terminal, a first electrode of the third transistor is connected to the first control signal terminal, and a second electrode of the third transistor is connected to a first node; and a gate of the fourth transistor is connected to the input signal terminal, a first electrode of the fourth transistor is connected to the first node, and a second electrode of the fourth transistor is connected to the pull-up node.

Optionally, the reset sub-circuit comprises: a fifth transistor and a sixth transistor; wherein a gate of the fifth transistor is connected to the reset signal terminal, a first electrode of the fifth transistor is connected to the second control signal terminal, and a second electrode of the fifth transistor is connected to a second node; and a gate of the sixth transistor is connected to the reset signal terminal, a first electrode of the sixth transistor is connected to the second node, and a second electrode of the sixth transistor is connected to the pull-up node.

Optionally, the first pull-down control sub-circuit comprises: a seventh transistor, and the second pull-down control sub-circuit comprises: an eighth transistor; wherein a gate and a first electrode of the seventh transistor are connected to the second power source terminal, and a second electrode of the seventh transistor is connected to the pull-down node; and a gate of the eighth transistor is connected to the pull-up node, a first electrode of the eighth transistor is connected to the first power source terminal, and a second electrode of the eighth transistor is connected to the pull-down node.

Optionally, the noise reduction sub-circuit comprises: a ninth transistor and a tenth transistor; wherein a gate of the ninth transistor is connected to the pull-down node, a first electrode of the ninth transistor is connected to the first power source terminal, and a second electrode of the ninth transistor is connected to the pull-up node; and a gate of the tenth transistor is connected to the pull-down node, a first electrode of the tenth transistor is connected to the first power source terminal, and a second electrode of the tenth transistor is connected to the output terminal.

Optionally, the input sub-circuit comprises: a third transistor and a fourth transistor; and the shift register circuit further comprises a reset sub-circuit, the reset sub-circuit comprises: a fifth transistor and a sixth transistor; and the noise reduction sub-circuit further comprises: an eleventh transistor and a twelfth transistor; wherein a gate of the eleventh transistor is connected to the pull-down node, a first electrode of the eleventh transistor is connected to the first power source terminal, and a second electrode of the eleventh transistor is connected to the second electrode of the third transistor and the first electrode of the fourth transistor respectively; and a gate of the twelfth transistor is connected to the pull-down node, a first electrode of the twelfth transistor is connected to the first power source terminal, and a second electrode of the twelfth transistor is connected to the second electrode of the fifth transistor and the first electrode of the sixth transistor respectively.

Optionally, the shift register circuit further comprises: a thirteenth transistor; wherein a gate of the thirteenth transistor is connected to a general reset signal terminal, a first electrode of the thirteenth transistor is connected to the first power source terminal, and a second electrode of the thirteenth transistor is connected to the pull-up node.

Optionally, the shift register circuit further comprises: a fourteenth transistor; wherein a gate of the fourteenth transistor is connected to the general reset signal terminal, a first electrode of the fourteenth transistor is connected to the first power source terminal, and a second electrode of the fourteenth transistor is connected to the output terminal.

Optionally, the input sub-circuit comprises: a fifteenth transistor and a capacitor; wherein a gate of the fifteenth transistor is connected to the pull-up node, a first electrode of the fifteenth transistor is connected to the clock signal terminal, and a second electrode of the fifteenth transistor is connected to the output terminal; and one terminal of the capacitor is connected to the pull-up node, and the other terminal of the capacitor is connected to the output terminal.

In another aspect, there is provided a driving method of a shift register circuit for driving the shift register circuit described above, wherein the shift register circuit comprises: an input sub-circuit, an output sub-circuit, a discharge sub-circuit and a noise reduction sub-circuit, and the method comprises:

at an input stage, under the control of an input signal provided by an input signal terminal, outputting, by the input sub-circuit, a first control signal from a first control signal terminal to the pull-up node, and outputting, by the discharge sub-circuit, a first power source signal from the first power source terminal to the pull-down node; and at an output stage, under the control of the pull-up node, outputting, by the output sub-circuit, a first clock signal to the output terminal output by an output terminal.

Optionally, the shift register circuit further comprises: a reset sub-circuit, wherein the reset sub-circuit is connected to a reset signal terminal, a second control signal terminal and the pull-up node respectively; and after the output stage, the method further comprises: at a reset stage, under the control of a reset signal provided by the reset signal terminal, outputting, by the reset sub-circuit, a second control signal from the second control signal terminal to the pull-up node, and outputting, by the discharge sub-circuit, the first power source signal to the pull-down node.

Optionally, the shift register circuit further comprises: a first pull-down control sub-circuit and a second pull-down control sub-circuit, wherein the first pull-down control sub-circuit is connected to the pull-down node and a second power source terminal respectively, and the second pull-down control sub-circuit is connected to the pull-up node, the pull-down node and the first power source terminal respectively; at the input stage and the output stage, the second pull-down control sub-circuit, under the control of the pull-up node, outputs the first power source signal to the pull-down node; and after the reset stage, the method further comprises: at a noise reduction stage, under the control of a second power source signal provided by the second power source terminal, outputting, by the first pull-down control sub-circuit, the second power source signal to the pull-down node, and under the control of the pull-down node, outputting, by the noise reduction sub-circuit, the first power source signal to the pull-up node and the output terminal respectively.

Optionally, the shift register circuit further comprises: a thirteenth transistor, wherein a gate of the thirteenth transistor is connected to a general reset signal terminal, a first electrode of the thirteenth transistor is connected to the first power source terminal, and a second electrode of the thirteenth transistor is connected to the pull-up node; and after the noise reduction stage, the method further comprises: at a general reset stage, turning on the thirteenth transistor under the control of a general reset signal provided by the general reset signal terminal, and outputting by the first power source terminal the first power source signal to the pull-up node via the thirteenth transistor.

In yet another aspect, there is provided a gate drive circuit, comprising: at least two cascaded shift register circuits described above; wherein an output terminal of each stage of shift register circuit is connected to a reset signal terminal of a previous stage of shift register circuit; and an output terminal of each stage of shift register circuit is connected to an input signal terminal of a next stage of shift register circuit.

In still yet another aspect, there is provided a display device, comprising the gate drive circuit described above.

DETAILED DESCRIPTION

Figure 1:
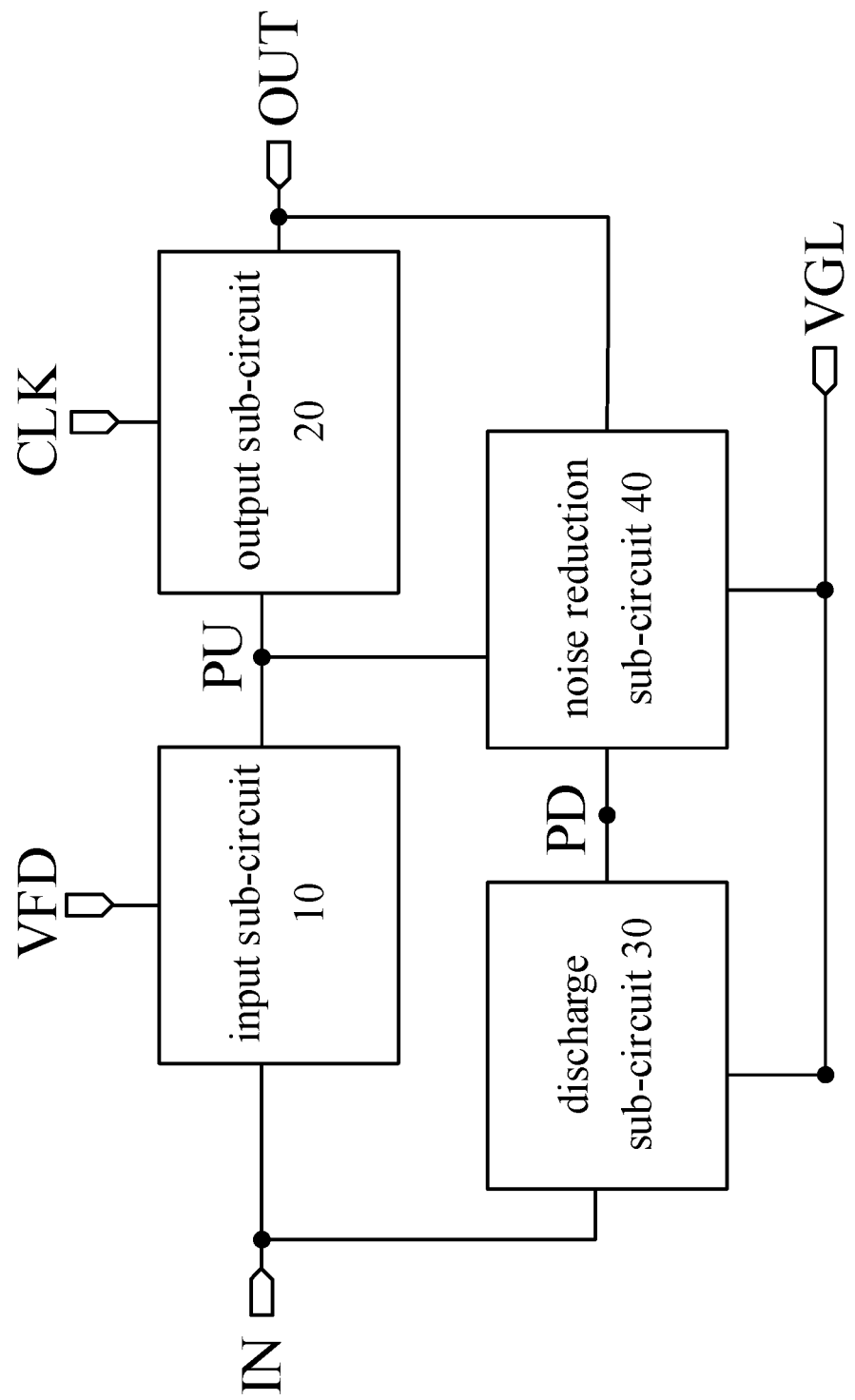
FIG. 1 is a schematic structural diagram of a shift register circuit according to an embodiment of the present disclosure.

The embodiments of the present disclosure will be described in further detail with reference to the accompanying drawings, to make the principles and advantages of the present disclosure clearer.

Transistors adopted in all the embodiments of the present disclosure may be thin-film transistors or field-effect transistors or other devices having the same features. According to the function in a circuit, the transistors adopted in the embodiments of the present disclosure are generally switch transistors. Since a source and drain of a switch transistor adopted herein are symmetric, the source and drain may be exchanged. In the embodiments of the present disclosure, the source is referred to as a first electrode and the drain is referred to as a second electrode. According to form in the drawings, it is specified that a middle terminal of a transistor is the gate, a signal input terminal is the source, and a signal output terminal is the drain. The switch transistors adopted in the embodiments of the present disclosure may include any of P-type switch transistors and N-type transistors. The P-type switch transistor is turned on when the gate is at a low potential, and is turned off when the gate is at a high potential. The N-type switch transistor is turned on when the gate is at a high potential, and is turned off when the gate is at a low potential. In various embodiments of the present disclosure, each of a plurality of signals has a first potential and a second potential. The first potential and the second potential only indicate that the potential of the signal has two different state quantities, instead of indicating that the first potential or the second potential herein in this specification has a specific value.

FIG. 1 is a schematic structural diagram of a shift register circuit according to an embodiment of the present disclosure. As illustrated in FIG. 1, the shift register circuit may include: an input sub-circuit 10, an output sub-circuit 20, a discharge sub-circuit 30 and a noise reduction sub-circuit 40.

The input sub-circuit 10 is connected to an input signal terminal IN, a first control signal terminal VFD and a pull-up node PU respectively, and configured to, under the control of an input signal from the input signal terminal IN, output a first control signal from the first control signal terminal VFD to the pull-up node PU. The potential of the first control signal provided by the first control signal terminal VFD may be a first potential. In the embodiments of the present disclosure, the first potential may be an effective potential.

Exemplarily, at an input stage of the shift register circuit, the potential of the input signal output by the input signal terminal IN is the first potential. The input sub-circuit 10 may, under the control of the input signal, output the first control signal from the first control signal terminal VFD, to the pull-up node PU.

The output sub-circuit 20 is connected to a clock signal terminal CLK, the pull-up node PU and an output terminal OUT respectively, and configured to, under the control of the pull-up node PU, output a clock signal from the clock signal terminal CLK to the output terminal OUT.

Exemplarily, when the potential of the pull-up node PU is the first potential, the output sub-circuit 20 may, under the control of the pull-up node PU, output the clock signal from the clock signal terminal CLK to the output terminal OUT.

The discharge sub-circuit 30 is connected to the input signal terminal IN, a first power source terminal VGL and a pull-down node PD respectively, and configured to, under the control of the input signal, output a first power source signal from the first power source terminal VGL to the pull-down node PD. The potential of the first power source signal may be a second potential. In the embodiments of the present disclosure, the second potential may be an ineffective potential.

Exemplarily, at the input stage of the shift register circuit, the potential of the input signal output by the input signal terminal IN is the first potential. The input sub-circuit 30 may, under the control of the input signal, output the first power source signal from the first power source terminal VGL, to the pull-down node PD.

The noise reduction sub-circuit 40 is connected to the pull-down node PD, the first power source terminal VGL, the pull-up node PU and the output terminal OUT respectively, and configured to, under the control of the pull-down node PD, output the first power source signal to the pull-up node PU and the output terminal OUT respectively.

Exemplarily, when the potential of the pull-down node PD is the first potential, the noise reduction sub-circuit 40 may, under the control of the pull-down node PD, output the first power source signal from the first power source terminal VGL to the pull-up node PU and the output terminal OUT respectively. When the potential of the pull-down node PD is the second potential, the noise reduction sub-circuit 40 is in a non-working state and may not affect the potential of the pull-up node PU and the potential of the output terminal OUT.

In summary, the shift register circuit according to the embodiment of the present disclosure includes the input sub-circuit, the output sub-circuit, the discharge sub-circuit and the noise reduction sub-circuit. The discharge sub-circuit in the shift register circuit may, under the control of the input signal, output the first power source signal to the pull-down node. Therefore, the potential of the first power source signal may be set to be an ineffective potential, such that the discharge sub-circuit may control the potential of the pull-down node to be an ineffective potential when the potential of the input signal is an effective potential (that is, at the input stage). In this way, the noise reduction sub-circuit may be prevented from affecting the potentials of the pull-up node and the output terminal under the control of the pull-down node, and normal output of the shift register circuit is ensured.

Figure 2:
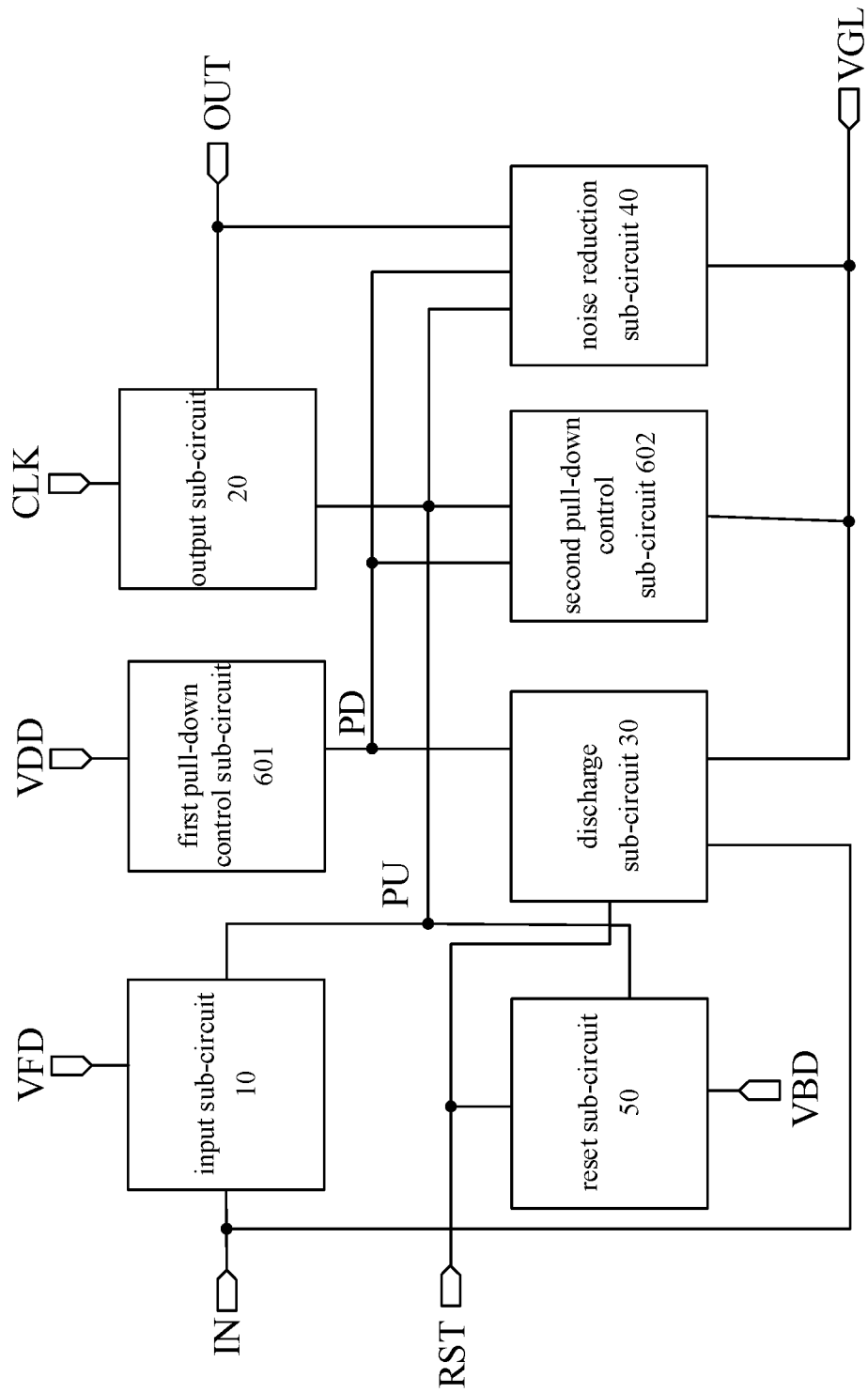
FIG. 2 is a schematic structural diagram of another shift register circuit according to an embodiment of the present disclosure.

FIG. 2 is a schematic structural diagram of another shift register circuit according to an embodiment of the present disclosure. As illustrated in FIG. 2, the shift register circuit may further include: a reset sub-circuit 50.

The reset sub-circuit 50 is connected to a reset signal terminal RST, a second control signal terminal VBD and the pull-up node PU respectively, and configured to, under the control of a reset signal from the reset signal terminal RST, output a second control signal from the second control signal terminal VBD to the pull-up node PU. The potential of the second control signal is the second potential.

The discharge sub-circuit 30 may be further connected to the reset signal terminal RST, and the discharge sub-circuit

30 may be further configured to, under the control of the reset signal, output the first power source signal to the pull-down node PD.

Exemplarily, at a reset stage of the shift register circuit, the potential of the reset signal output by the reset signal terminal RST is the first potential. The reset sub-circuit 50 may, under the control of the reset signal, output a second control signal from the second control signal terminal VBD, to the pull-up node PU. Meanwhile, the discharge sub-circuit 30 may further, under the control of the reset signal, output the first power source signal from the first power source terminal VGL to the pull-down node PD.

Optionally, referring to FIG. 2, the shift register circuit may further includes a first pull-down control sub-circuit 601 and a second pull-down control sub-circuit 602.

The first pull-down control sub-circuit 601 is connected to the pull-down node PD and a second power source terminal VDD, and configured to, under the control of a second power source signal from the second power source terminal VDD, output the second power source signal to the pull-down node PD. The potential of the second power source signal is a first potential.

The second pull-down control sub-circuit 602 is connected to the pull-up node PU, the pull-down node PD and the first power source terminal VGL respectively, and configured to, under the control of the pull-up node PU, output the first power source signal from the first power source terminal VGL to the pull-down node PD.

Exemplarily, when the potential of the pull-up node PU is the second potential, the first pull-down control sub-circuit 601 may, under the control of the second power source terminal VDD, output the second power source signal to the pull-down node PD. When the potential of the pull-up node PU is the first potential, the second pull-down control sub-circuit 602 may, under the control of the pull-up node PU, output the first power source signal from the first power source terminal VGL to the pull-down node PD.

Figure 3:
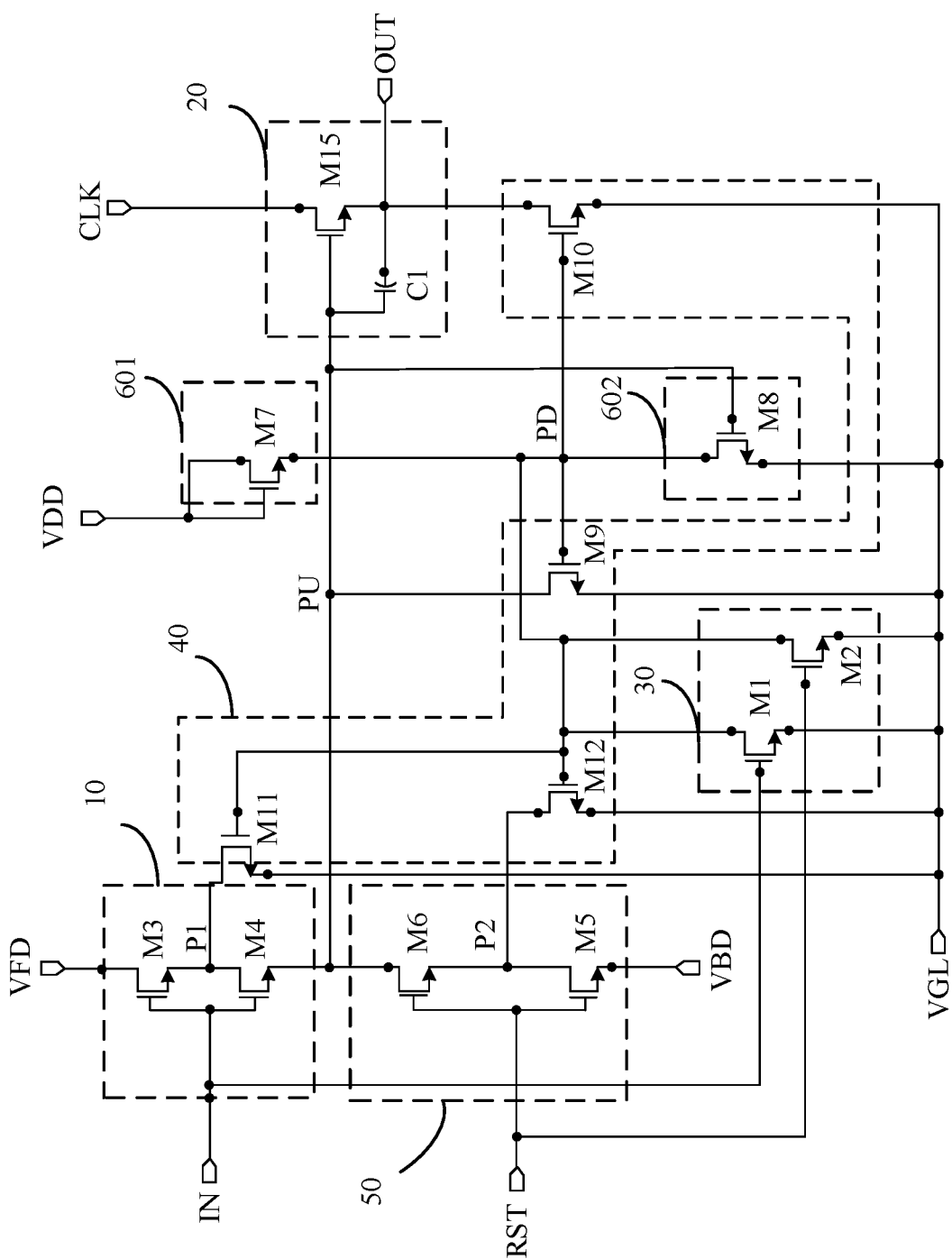
FIG. 3 is a schematic structural diagram of yet another shift register circuit according to an embodiment of the present disclosure.

FIG. 3 is a schematic structural diagram of yet another shift register circuit according to an embodiment of the present disclosure. As illustrated in FIG. 3, the discharge sub-circuit 30 may include: a first transistor M1.

A gate of the first transistor M1 is connected to the input signal terminal IN, a first electrode of the first transistor M1 is connected to the first power source terminal VGL, and a second electrode of the first transistor M1 is connected to the pull-down node PD.

Optionally, the reset signal terminal RST is configured to provide an input signal during the reverse scanning process. In order to ensure that the pull-down node PD may also be discharged by the discharge sub-circuit 30 during the reverse scanning process, as shown in FIG. 3, the discharge sub-circuit 30 may further include: a second transistor M2.

A gate of the second transistor M2 is connected to the reset signal terminal RST, a first electrode of the second transistor M2 is connected to the first power source terminal VGL, and a second electrode of the second transistor M2 is connected to the pull-down node PD.

Optionally, referring to FIG. 3, the input sub-circuit 10 may include: a third transistor M3 and a fourth transistor M4.

A gate of the third transistor M3 is connected to the input signal terminal IN, a first electrode of the third transistor M3 is connected to the first control signal terminal VFD, and a second electrode of the third transistor M3 is connected to a first node P1.

A gate of the fourth transistor M4 is connected to the input signal terminal IN, a first electrode of the fourth transistor M4 is connected to the first node P1, and a second electrode of the fourth transistor is connected to the pull-up node PU.

Optionally, referring to FIG. 3, the reset sub-circuit 20 may include: a fifth transistor M5 and a sixth transistor M6.

A gate of the fifth transistor M5 is connected to the reset signal terminal RST, a first electrode of the fifth transistor M5 is connected to the second control signal terminal VBD, and a second electrode of the fifth transistor M5 is connected to a second node P2.

A gate of the sixth transistor M6 is connected to the reset signal terminal RST, a first electrode of the sixth transistor M6 is connected to the second node P2, and a second electrode of the sixth transistor M6 is connected to the pull-up node PU.

Optionally, referring to FIG. 3, the first pull-down control sub-circuit 601 may include: a seventh transistor M7. The second pull-down control sub-circuit 602 may include: an eighth transistor M8.

A gate and a first electrode of the seventh transistor M7 are connected to the second power source terminal VDD, and a second electrode of the seventh transistor M7 is connected to the pull-down node PD.

A gate of the eighth transistor M8 is connected to the pull-up node PU, a first electrode of the eighth transistor M8 is connected to the first power source terminal VGL, and a second electrode of the eighth transistor M8 is connected to the pull-down node PD.

Optionally, referring to FIG. 3, the noise reduction sub-circuit 40 may include: a ninth transistor M9 and a tenth transistor M10.

A gate of the ninth transistor M9 is connected to the pull-down node PD, a first electrode of the ninth transistor M9 is connected to the first power source terminal VGL, and a second electrode of the ninth transistor M9 is connected to the pull-up node PU.

A gate of the tenth transistor M10 is connected to the pull-down node PD, a first electrode of the tenth transistor M10 is connected to the first power source terminal VGL, and a second electrode of the tenth transistor M10 is connected to the output terminal OUT.

The input sub-circuit 10 is formed by the third transistor M3 and the fourth transistor M4 that are connected in series, and the first electrode of the third transistor M3 is connected to the first control signal terminal VFD. The reset sub-circuit 50 is formed by the fifth transistor M5 and the sixth transistor M6 that are connected in series, and the first electrode of the sixth transistor M6 is connected to the second control signal terminal VBD. Therefore, to prevent leakage currents of the third transistor M3 and the fourth transistor M4, and leakage currents of the fifth transistor M5 and the sixth transistor M6 after an output stage from affecting the potential of the pull-up node PU, referring to FIG. 3, the noise reduction sub-circuit 40 may further include: an eleventh transistor M11 and a twelfth transistor M12.

A gate of the eleventh transistor M11 is connected to the pull-down node PD, a first electrode of the eleventh transistor M11 is connected to the first power source terminal VGL, and a second electrode of the eleventh transistor M11 is connected to the second electrode of the third transistor M3 and the first electrode of the fourth transistor M4 respectively, that is, the second electrode of the eleventh transistor M11 is connected to the first node P1.

A gate of the twelfth transistor M12 is connected to the pull-down node PD, a first electrode of the twelfth transistor M12 is connected to the first power source terminal VGL, and a second electrode of the twelfth transistor M12 is connected to the second electrode of the fifth transistor M5 and the first electrode of the sixth transistor M6 respectively, that is, the second electrode of the twelfth transistor M12 is connected to the second node P2.

When the potential of the pull-down node PD is the first potential, and the potential of the pull-up node PU is the second potential, the eleventh transistor M11 and the twelfth transistor M12 are turned on. The first power source terminal VGL may output the first power source signal to the first node P1, and output the first power source signal to the second node P2, such that potentials of the first electrode and the second electrode of the fourth transistor M4 are both the second potential, and thus a leakage current of the first node P1 is effectively reduced. Analogously, potentials of the first electrode and the second electrode of the sixth transistor M6 may both be the second potential, such that a leakage current of the second node P2 is effectively reduced, and thus the potential of the pull-up node PU may be prevented from being affected.

Figure 4:
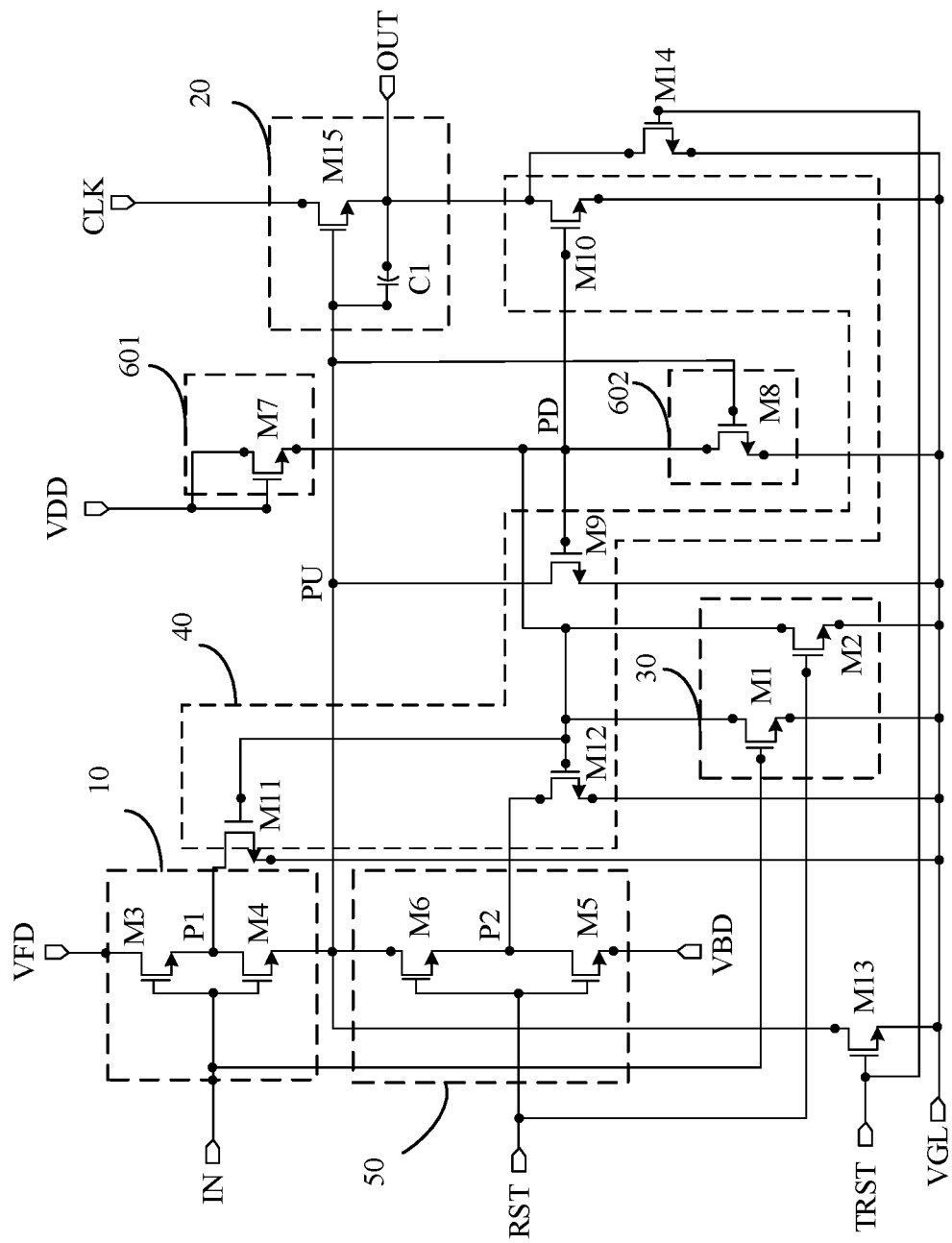
FIG. 4 is a schematic structural diagram of still yet another shift register circuit according to an embodiment of the present disclosure.

Optionally, FIG. 4 is a schematic structural diagram of still yet another shift register circuit according to an embodiment of the present disclosure. As illustrated in FIG. 4, the shift register circuit may further include: a thirteenth transistor M13.

A gate of the thirteenth transistor M13 is connected to a general reset signal terminal TRST, a first electrode of the thirteenth transistor M13 is connected to the first power source terminal VGL, and a second electrode of the thirteenth transistor M13 is connected to the pull-up node PU.

In the embodiment of the present disclosure, the general reset signal terminal TRST may be connected to the gate of the thirteenth transistor M13 in each stage of shift register circuit. The general reset signal terminal TRST may output a general reset signal in the first potential after the output stage of the last stage of shift register circuit, such that the pull-up node PU of the last stage of shift register circuit is reset, and the pull-up node PU of each stage of shift register circuit in a gate drive circuit is generally reset.

Referring to FIG. 4, the shift register circuit may further include: a fourteenth transistor M14.

A gate of the fourteenth transistor M14 is connected to the general reset signal terminal TRST, a first electrode of the fourteenth transistor M14 is connected to the first power source terminal VGL, and a second electrode of the fourteenth transistor M14 is connected to the output terminal OUT.

In the embodiment of the present disclosure, the general reset signal terminal TRST may be connected to the gate of the fourteenth transistor M14 of each stage of shift register circuit, such that the pull-up node PU of the last stage of shift register circuit is reset, and the output terminal OUT of each stage of shift register circuit in the gate drive circuit is generally reset.

Optionally, referring to FIG. 3, the output sub-circuit 20 may include: a fifteenth transistor M15 and a capacitor C1.

A gate of the fifteenth transistor M15 is connected to the pull-up node PU, a first electrode of the fifteenth transistor M15 is connected to the clock signal terminal CLK, and a second electrode of the fifteenth transistor M15 is connected to the output terminal OUT.

One terminal of the capacitor C1 is connected to the pull-up node PU, and the other terminal of the capacitor C1 is connected to the output terminal OUT.

In summary, the shift register circuit according to the embodiment of the present disclosure includes the input sub-circuit, the output sub-circuit, the discharge sub-circuit and the noise reduction sub-circuit. The discharge sub-circuit in the shift register circuit may, under the control of the input signal, output the first power source signal to the pull-down node. Therefore, the potential of the first power source signal may be set to be an ineffective potential, such that the discharge sub-circuit may control the potential of the pull-down node to be an ineffective potential when the potential of the input signal is an effective potential (that is, at the input stage). In this way, the noise reduction sub-circuit may be prevented from affecting the potentials of the pull-up node and the output terminal under the control of the pull-down node, and normal output of the shift register circuit is ensured.

Figure 5:
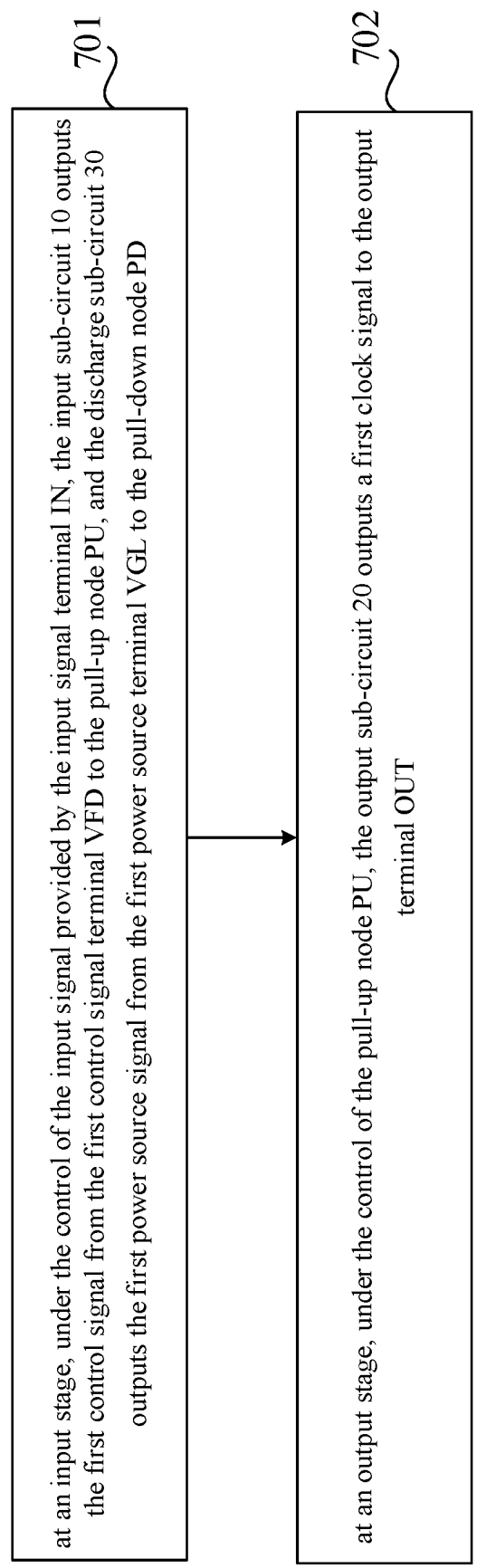
FIG. 5 is a flowchart of a driving method of a shift register circuit according to an embodiment of the present disclosure.

FIG. 5 is a flowchart of a driving method of a shift register circuit according to an embodiment of the present disclosure. The driving method may be applied to drive the shift register circuit as illustrated in any one of FIG. 1 to FIG. 4. Referring to FIG. 5, the driving method may include the following steps.

In step 701, at an input stage, under the control of the input signal provided by the input signal terminal IN, the input sub-circuit 10 outputs the first control signal from the first control signal terminal VFD to the pull-up node PU, and the discharge sub-circuit 30 outputs the first power source signal from the first power source terminal VGL to the pull-down node PD.

In the embodiment of the present disclosure, at the input stage, the potential of the input signal provided by the input signal terminal IN is the first potential (that is, the effective potential). The discharge sub-circuit 30 may, under the control of the input signal, output the first power source signal at the second potential (the second potential is an ineffective potential) to the pull-down node PD. In this way, the transistors in the noise reduction sub-circuit 40 are turned off, to prevent the noise reduction sub-circuit 40 from affecting, under the control of the pull-down node PD, the potentials of the pull-up node PU and the output terminal OUT.

In step 702, at an output stage, under the control of the pull-up node PU, the output sub-circuit 20 outputs a first clock signal to the output terminal OUT.

In the embodiment of the present disclosure, at the output stage, the potential of the pull-up node PU is the first potential, and the output sub-circuit 20 may, under the control of the pull-up node PU, outputs a clock signal at the first potential to the output terminal OUT, such that a row of pixel circuits are scanned.

In summary, in the driving method of the shift register circuit according to the embodiment of the present disclosure, at the input stage, the discharge sub-circuit may, under the control of the input signal, output the first power source signal to the pull-down node. Since the potential of the first power source signal is an ineffective potential, the noise reduction sub-circuit may be prevented from affecting the potentials of the pull-up node and the output terminal under the control of the pull-down node, and normal output of the shift register circuit is ensured.

Optionally, referring to FIG. 2, the shift register circuit may further include: a reset sub-circuit 50. The reset sub-circuit 50 is connected to the reset signal terminal RST, the second control signal terminal VBD and the pull-up node PU respectively. After the output stage in step 102, the method may further include: a reset stage.

At the reset stage, under the control of a reset signal provided by the reset signal terminal RST, the reset sub-circuit 50 outputs a second control signal from the second control signal terminal VBD to the pull-up node PU. The potential of the second control signal is the second potential, and thus the pull-up node PU may be reset. Meanwhile, the discharge sub-circuit 30 may, under the control of the reset signal, output a first power source signal to the pull-down node PD. The potential of the first power source signal is the second potential, and the noise reduction sub-circuit 40 may, under the control of the pull-down node PD, maintain a non-working state.

Still referring to FIG. 2, the shift register circuit may further include: a first pull-down control sub-circuit 601 and a second pull-down control sub-circuit 602. The first pull-down control sub-circuit 601 is connected to the pull-down node PD and a second power source terminal VDD respectively. The second pull-down control sub-circuit 602 is connected to the pull-up node PU, the pull-down node PD and the first power source terminal VGL respectively.

At the input stage and the output stage, under the control of the pull-up node PU, the second pull-down control sub-circuit 602 may output the first power source signal at the second potential to the pull-down node PD. The noise reduction sub-circuit 40 may, under the control of the pull-down node PD, maintain a non-working state, such that the potentials of the pull-up node PU and the output terminal OUT are prevented from being affected.

Optionally, after the reset stage, the method may further include: a noise reduction stage.

At the noise reduction stage, under the control of a second power source signal provided by the second power source terminal VDD, the first pull-down control sub-circuit 601 may output the second power source signal at the first potential to the pull-down node PD. Under the control of the pull-down node PD, the noise reduction sub-circuit 40 may output the first power source signal at the second potential to the pull-up node PU and the output terminal OUT respectively, thereby reducing noise for the pull-up node PU and the output terminal OUT.

Optionally, referring to FIG. 4, the shift register circuit may further include: a thirteenth transistor M13. A gate of the thirteenth transistor M13 is connected to a general reset signal terminal TRST, a first electrode of the thirteenth transistor M13 is connected to the first power source terminal VGL, and a second electrode of the thirteenth transistor M13 is connected to the pull-up node PU. After the noise reduction stage, the method may further include: a general reset stage.

At the general reset stage, the thirteenth transistor M13 is turned on under the control of a general reset signal provided by the general reset signal terminal TRST, and the first power source terminal VGL outputs the first power source signal to the pull-up node PU via the thirteenth transistor M13, such that the pull-up node PU is reset.

Figure 6:
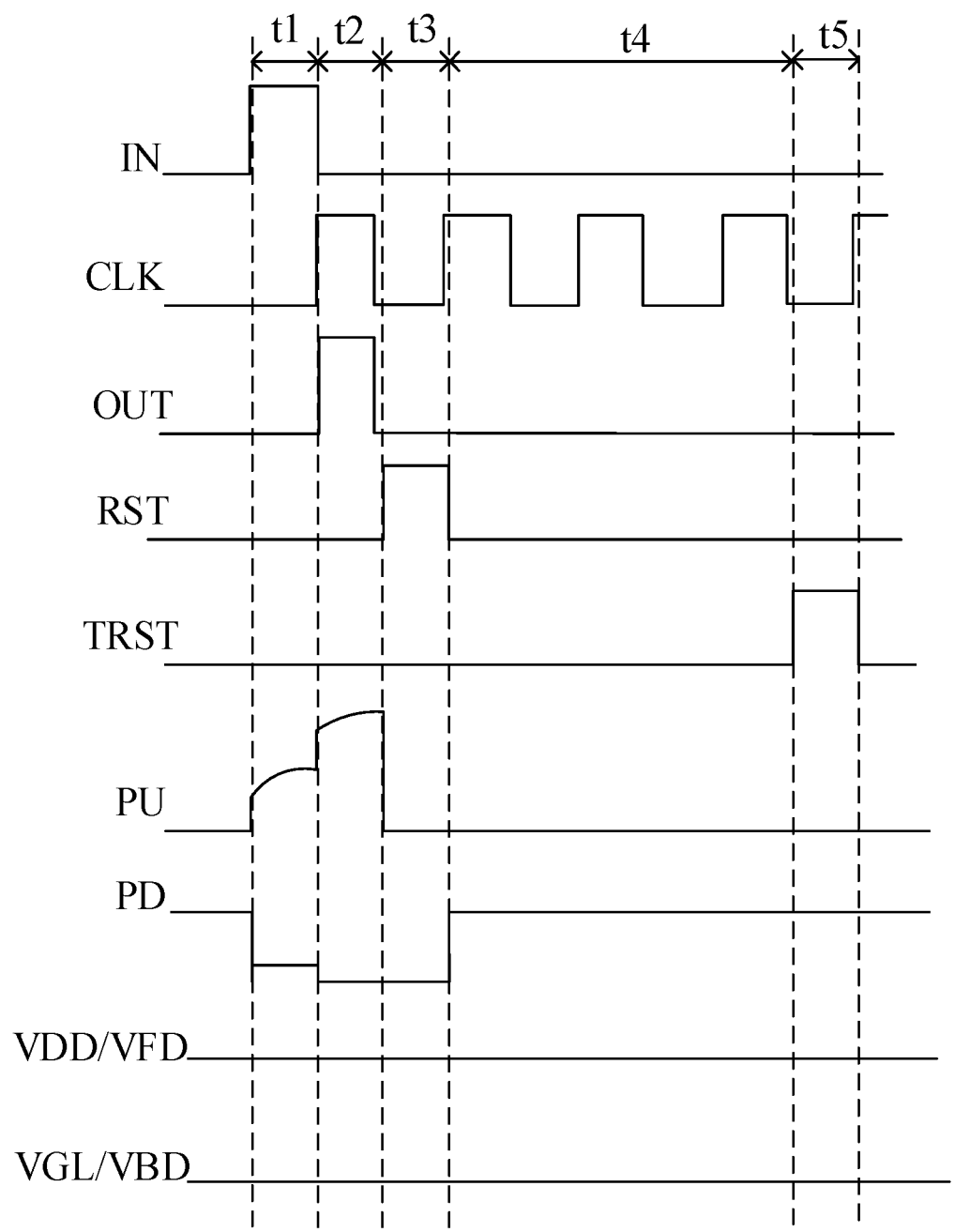
FIG. 6 is a time sequence diagram of a driving process of a shift register circuit according to an embodiment of the present disclosure.

FIG. 6 is a time sequence diagram of various signal terminals during a driving process of the shift register circuit according to an embodiment of the present disclosure. Taking the shift register circuit illustrated in FIG. 4 as an example, and taking an example in which the transistors in the shift register circuit are N-type transistors, the potential of the first control signal output by the first control signal terminal VFD is the first potential, the potential of the second control signal output by the second control signal terminal VBD is the second potential, and the first potential is a high potential relative to the second potential, the driving principle of the shift register circuit according to the embodiment of the present disclosure is described hereinafter in detail.

Figure 7:
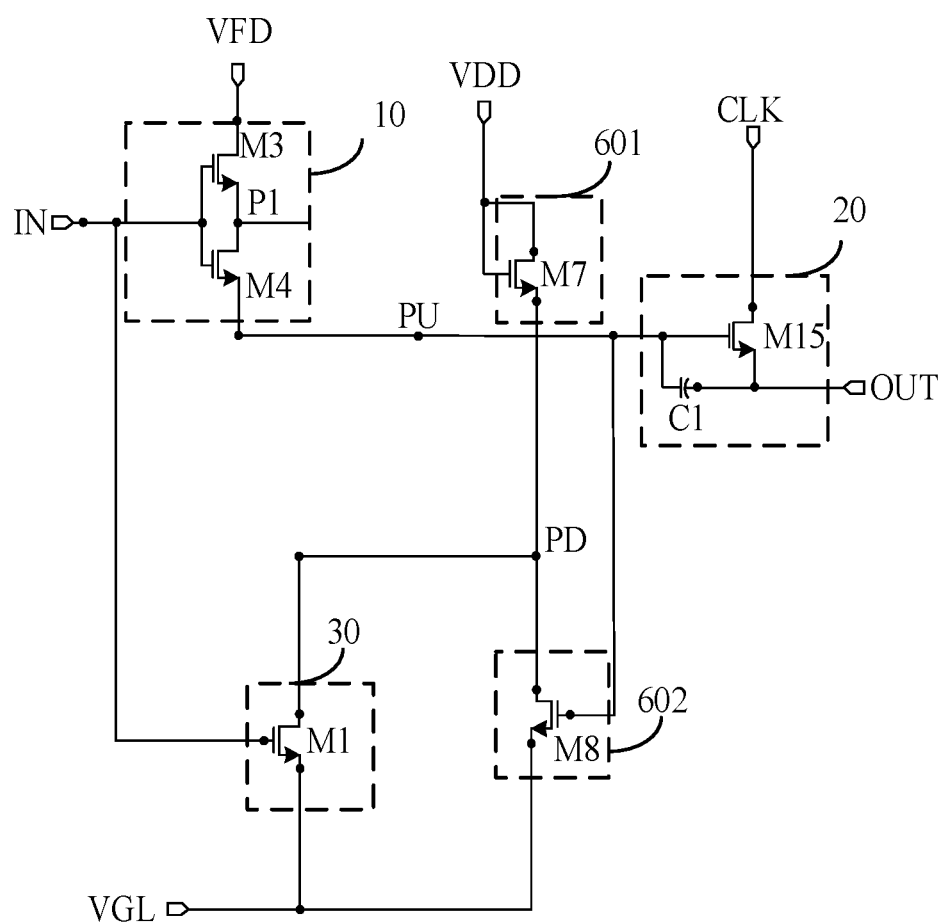
FIG. 7 is a an equivalent circuit diagram of a shift register circuit at an input stage according to an embodiment of the present disclosure.

As illustrated in FIG. 6, at an input stage t1, the potential of the clock signal output by the clock signal terminal CLK is the second potential, and the potential of the input signal output by the input signal terminal IN is the first potential. The first transistor M1, the third transistor M3 and the fourth transistor M4 are turned on under the control of the input signal. The first control signal terminal VFD outputs the first control signal at the first potential to the pull-up node PU via the third transistor M3 and the fourth transistor M4, such that the potential of the pull-up node PU is pulled up. In this way, the pull-up node PU is charged. The fifteenth transistor M15 and the eighth transistor M8 are turned on under the control of the pull-up node PU, the clock signal terminal CLK outputs the clock signal at the second potential to the output terminal OUT via the fifteenth transistor M5, and the first power source terminal VGL outputs the first power source signal at the second potential to the pull-down node PD via the eighth transistor M8. The equivalent circuit diagram of the shift register circuit at the input stage t1 may be made reference to FIG. 7.

Figure 8:
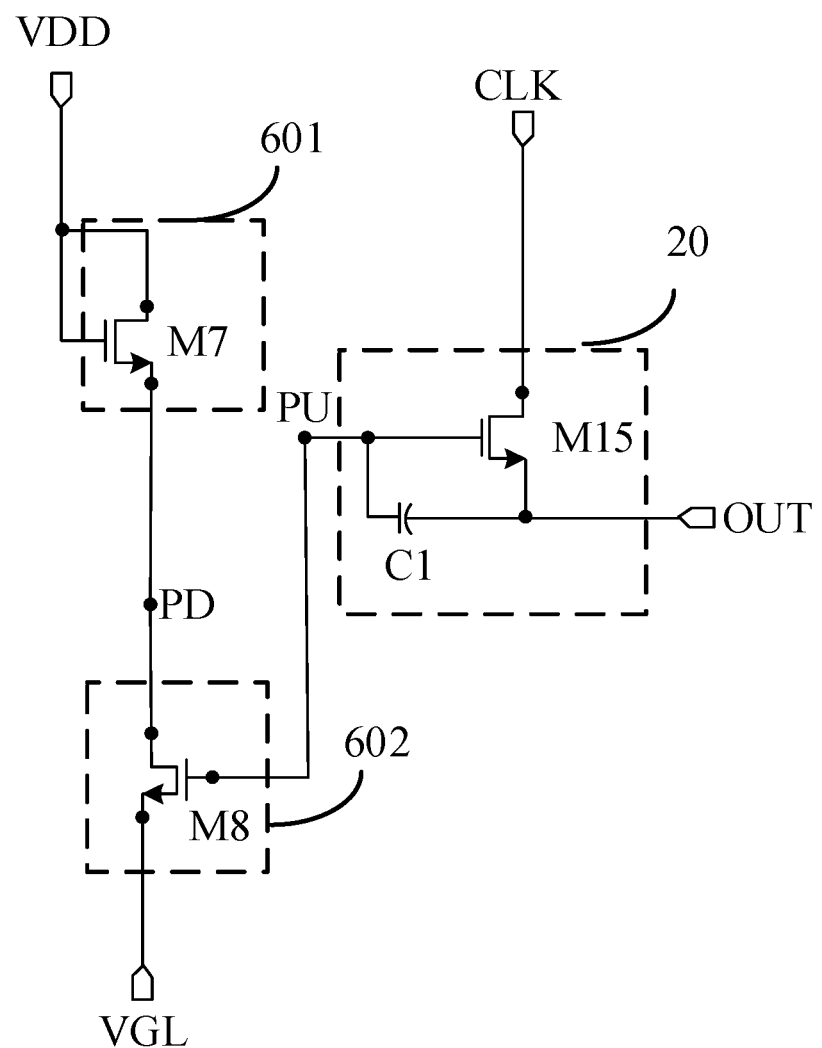
FIG. 8 is an equivalent circuit diagram of a shift register circuit at an output stage according to an embodiment of the present disclosure.

At an output terminal t2, the potential of the clock signal output by the clock signal terminal CLK jumps to the first potential, and the potential of the input signal output by the input signal terminal IN jumps to the second potential. The first transistor M1, the third transistor M3 and the fourth transistor M4 are turned off. The potential of the pull-up node PU is further pulled up under the coupling effect of the capacitor C1, the fifteenth transistor M15 is fully turned on. The clock signal terminal CLK outputs the clock signal at the first potential to the output terminal OUT via the fifteenth transistor M15, such that a row of pixel circuits are scanned. The eighth transistor M8 is still turned on, and the first power source terminal VGL may continuously output the first power source signal at the second potential to the pull-down node PD. The equivalent circuit diagram of the shift register circuit at the output stage t1 may be made reference to FIG. 8.

Since the first power source terminal VGL may output the first power source signal at the second potential to the pull-down node PD via the eighth transistor M8 at the input stage t1 and the output stage t2, the ninth transistor M9, the tenth transistor M10, the eleventh transistor M11 and the twelfth transistor M12 may be controlled to be turned off, such that the potential of the pull-up node PU, the potential of the output terminal OUT, the potential of the first node P1 and the potential of the second node P2 may be prevented from being affected, and output stability of the shift register circuit is ensured.

Optionally, at the input stage t1 and the output stage t2, the potentials of the signals output by the reset signal terminal RST and the general reset signal terminal TRST are both at the second potential. The second transistor M2, the fifth transistor M5, the sixth transistor M6, the thirteenth transistor M13 and the fourteenth transistor M14 are turned off. The potential of the second power source signal output by the second power source terminal VDD is the first potential, and the seventh transistor M7 is turned on. However, at the input stage t1 and the output stage t2, the eighth transistor M8 may, under the control of the pull-up node PU, control the potential of the pull-down node PD to be the second potential. Therefore, even if the seventh transistor M7 is turned on, the second power source signal output by the second power source terminal VDD does not affect the potential of the pull-down node PD.

At a reset stage t3, the potential of the reset signal output by the reset signal terminal RST is the first potential, and the second transistor M2, the fifth transistor M5 and the sixth transistor M6 are turned on under the control of the reset signal. The second control signal terminal VBD outputs the second control signal at the second potential to the pull-up node PU via the fifth transistor M5 and the sixth transistor M6, to discharge the pull-up node. The fifteenth transistor M15 is turned off under the control of the pull-up node PU. Meanwhile, the first power source terminal VGL outputs the first power source signal at the second potential to the pull-down node PD via the second transistor M2, such that the pull-down node PD maintains a low potential. The ninth transistor M9, the tenth transistor M10, the eleventh transistor M11 and the twelfth transistor M12 are turned off.

Figure 9:
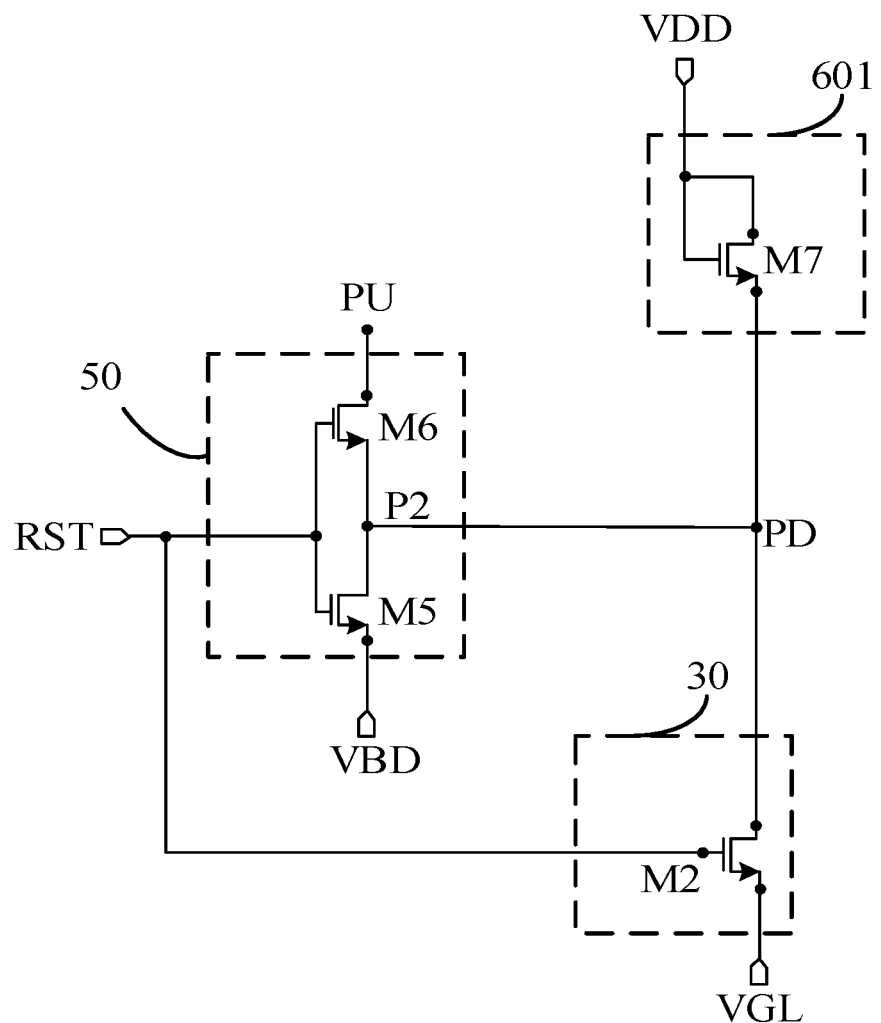
FIG. 9 is an equivalent circuit diagram of a shift register circuit at an reset stage according to an embodiment of the present disclosure.

At the reset stage t3, the potential of the input signal output by the input signal terminal IN is the second potential, and the first transistor M1, the third transistor M3 and the fourth transistor M4 are turned off. The general reset signal output by the general reset signal terminal TRST is at the second potential, and the thirteenth transistor M13 and the fourteenth transistor M14 are turned off. The second power source signal output by the second power source terminal VDD is at the first potential, and the seventh transistor M7 is turned on. However, at the reset stage t3, the eighth transistor M8 may, under the control of the pull-up node PU, control the potential of the pull-down node PD to be the second potential. Therefore, even if the seventh transistor M7 is turned on, the second power source signal output by the second power source terminal VDD does not affect the potential of the pull-down node PD. The equivalent circuit diagram of the shift register circuit at the reset stage t3 may be made reference to FIG. 9.

In the embodiment of the present disclosure, before the potential of the pull-up node PU is controlled to be the second potential via the reset signal, the fifteenth transistor M15 still be turned on. Since the potential of the clock signal output by the clock signal terminal CLK is the second potential at the reset stage t3, the clock signal terminal CLK may reset the output terminal OUT via the fifteenth transistor M15. Optionally, as illustrated in FIG. 6, the duty ratio of the clock signal may be less than ½. Therefore, before the reset stage t3, the clock signal terminal CLK may reset the output terminal OUT.

Figure 10:
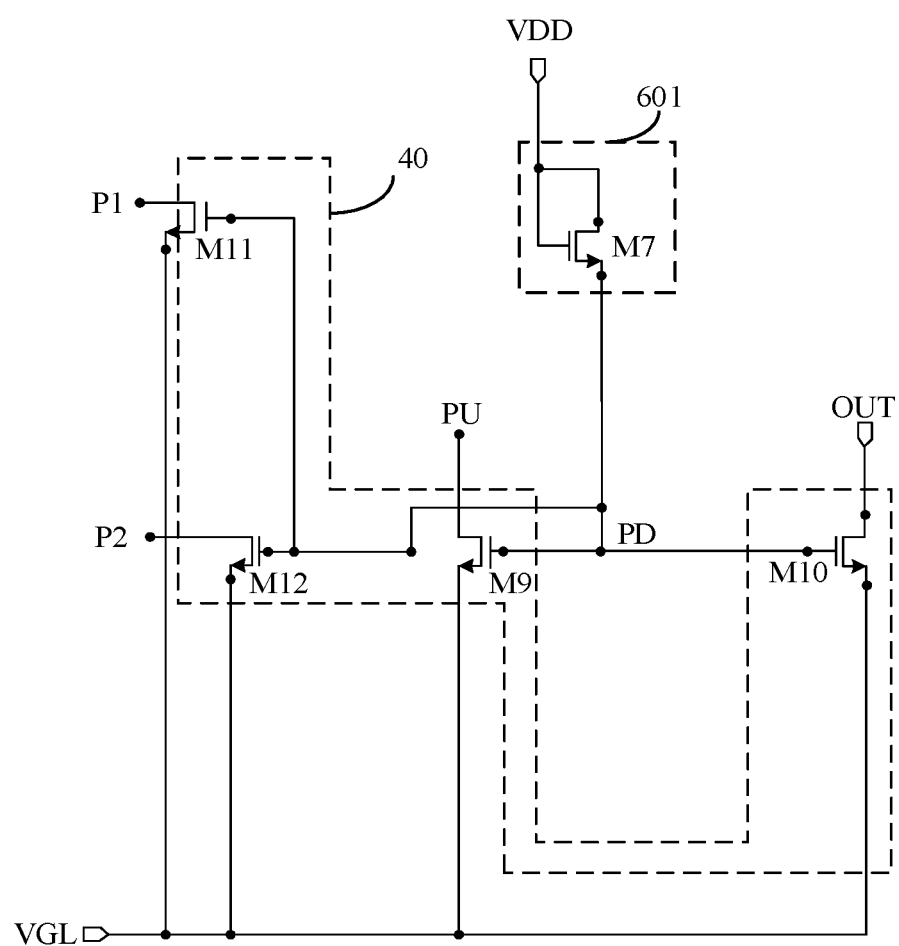
FIG. 10 is an equivalent circuit diagram of a shift register circuit at a noise reduction stage according to an embodiment of the present disclosure.

At a noise reduction stage t4, the second power source signal output by the second power source terminal VDD is at the first potential, and the seventh transistor M7 is turned on. At the reset stage t3, the reset sub-circuit 50 has reset the potential of the pull-up node PU to the second potential, such that the eighth transistor M8 is turned off. Therefore, the first power source terminal VGL may no longer output the first power source signal to the pull-down node PD. Therefore, in this case, the second power source terminal VDD may output the second power source signal at the first potential to the pull-down node PD via the seventh transistor M7, to pull up the potential of the pull-down node PD. Correspondingly, the ninth transistor M9, the tenth transistor M10, the eleventh transistor M11 and the twelfth transistor M12 may be turned on under the control of the pull-down node PD. The first power source terminal VGL may output the first power source signal at the second potential to the pull-up node PU via the ninth transistor M9, to reduce noise for the pull-up node PU. The first power source terminal VGL may output the first power source signal at the second potential to the output terminal OUT via the tenth transistor M10, to reduce noise for the output terminal OUT. The first power source terminal VGL may output the first power source signal at the second potential to the first node P1 via the eleventh transistor M11, to reduce noise for the first node P1. The first power source terminal VGL may output the first power source signal at the second potential to the second node P2 via the twelfth transistor M12, to reduce noise for the second node P2. The equivalent circuit diagram of the shift register circuit at the noise reduction stage t4 may be made reference to FIG. 10.

Figure 11:
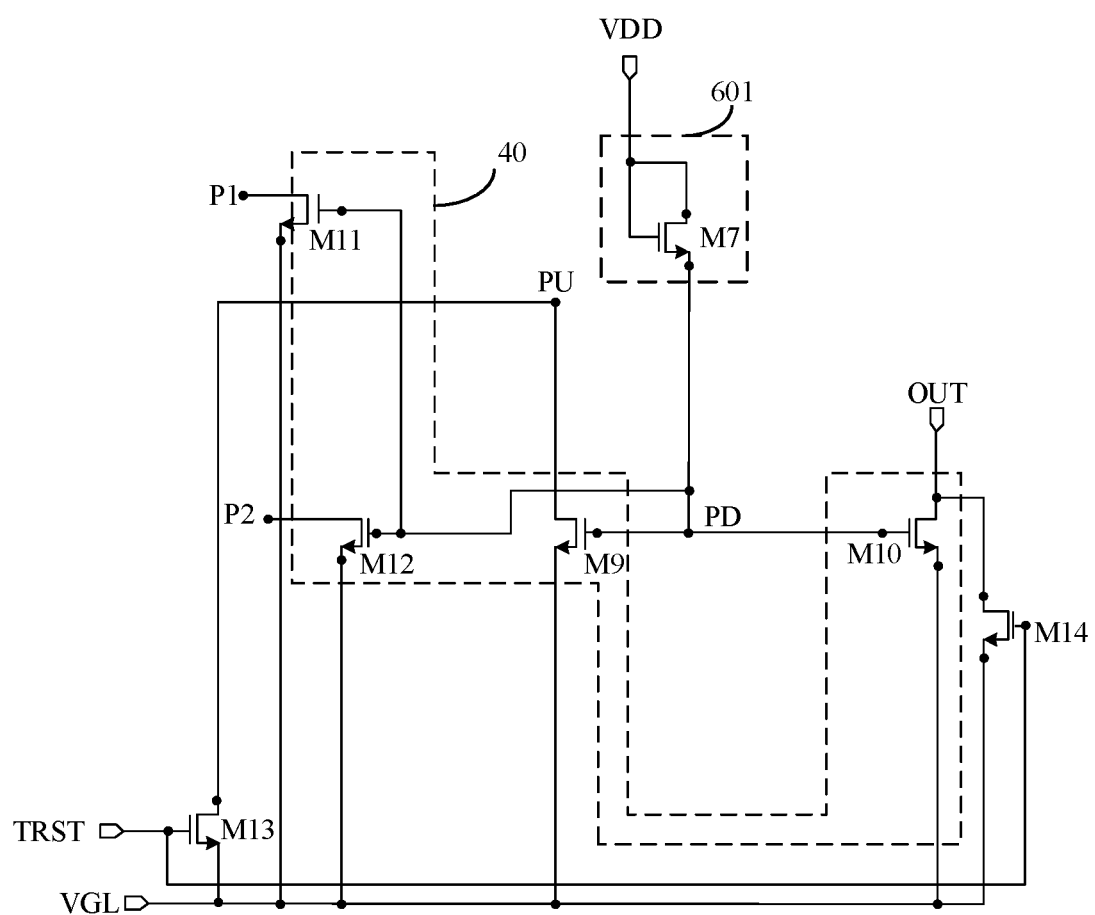
FIG. 11 is an equivalent circuit diagram of a shift register circuit at general reset stage according to an embodiment of the present disclosure.

Referring to FIG. 6, after the noise reduction stage t4, the method may further include a general reset stage t5. The general reset stage t5 may be a stage after the output stage of the last stage of shift register circuit. At the general reset state t5, the general reset signal terminal TRST may output the general reset signal at the first potential, such that the thirteenth transistor M13 and the fourteenth transistor M14 are turned on. The first power source terminal VGL may output the first power source signal at the second potential to the pull-up node PU via the thirteenth transistor M13, and output the first power source signal at the second potential to the output terminal OUT via the fourteenth transistor M14. In this way, noise reduction is continuously performed for the pull-up node PU and the output terminal OUT. The equivalent circuit diagram of the shift register circuit at the general reset stage t5 may be made reference to FIG. 11.

When the shift register circuit is not provided with the discharge sub-circuit 30, at the input stage t1, the pull-down node PD needs to be discharged by the eighth transistor M8 in the second pull-down control sub-circuit 602, to pull down the potential of the pull-down node PD and prevent the noise reduction sub-circuit 40 from affecting the potential of the pull-up node PU and causing poor charge of the pull-up node PU. Therefore, there is a high requirement on stability of the performance of the eighth transistor M8.

Generally, when an offset of a threshold voltage of the eighth transistor M8 is not greater than 4 volt (V), the eighth transistor M8 is capable of, under the control of the pull-up node PU, controlling the potential of the pull-down node PD, that is, an allowable offset of the threshold voltage of the eighth transistor M8 is 4V. When the offset of the threshold voltage of the eighth transistor M8 is greater than 4V, the eighth transistor M8 may not control the potential of the pull-down node PD, that is, the eight transistor M8 fails to effectively pull down the potential of the pull-down node PD. In this case, the noise reduction sub-circuit 10 may reduce noise for the pull-up node PU and the output terminal OUT under the control of the pull-down node PD. As a result, the pull-up node PU may not be normally charged, and the output terminal OUT of the shift register circuit may not normally output signals. In addition, at the input stage t1, the second power source terminal VDD may output the second power source signal at the first potential to the pull-down node PD via the seventh transistor M7, and the ninth transistor M9 and the eleventh transistor M11 are turned on. The first power source terminal VGL reduces noise for the first node P1 via the eleventh transistor M11, and the first power source terminal VGL reduces noise for the pull-up node PU via the ninth transistor M9. As a result, the charging capability of the first control signal terminal VFD to the pull-up node PU is weakened, such that the pull-up node PU may also fail to effectively control the potential of the pull-down node PD even if the offset of the threshold voltage of the eighth transistor M8 is small. Consequently, the output terminal OUT of the shift register circuit may fail to normally output signals.

The shift register circuit according to the embodiment of the present disclosure is provided with the discharge sub-circuit 30. The discharge sub-circuit 30 may discharge the pull-down node PD at the input stage t1. Therefore, the shift register circuit according to the embodiment of the present disclosure lowers the requirement on stability of the performance of the eighth transistor M8, such that the allowable offset of the threshold voltage of the eighth transistor M8 may increase to 11V. That is, when the offset of the threshold voltage of the eighth transistor M8 is not greater than 11V, the shift register circuit is capable of normally outputting signals, which improves the stability of the shift register circuit and reduces the risk that the shift register circuit may not normally output signals due to unstable techniques.

In the above embodiments, all the descriptions are given by taking examples in which the first transistor to the fifteenth transistor are N-type transistors, and the first potential is a high potential relative to the second potential. Certainly, the first transistor to the fifteenth transistor may also be P-type transistors. When the first transistor to the fifteenth transistor are P-type transistors, the first potential may be a low potential relative to the second potential, and potential changes of the signal terminals and nodes may be inverse to the potential changes as illustrated in FIG. 6.

In summary, in the driving method of the shift register circuit according to the embodiment of the present disclosure, at the input stage, the discharge sub-circuit may, under the control of the input signal, output the first power source signal to the pull-down node. Since the potential of the first power source signal is an ineffective potential, the noise reduction sub-circuit may be prevented from affecting the potentials of the pull-up node and the output terminal under the control of the pull-down node, and normal output of the shift register circuit is ensured.

Figure 12:
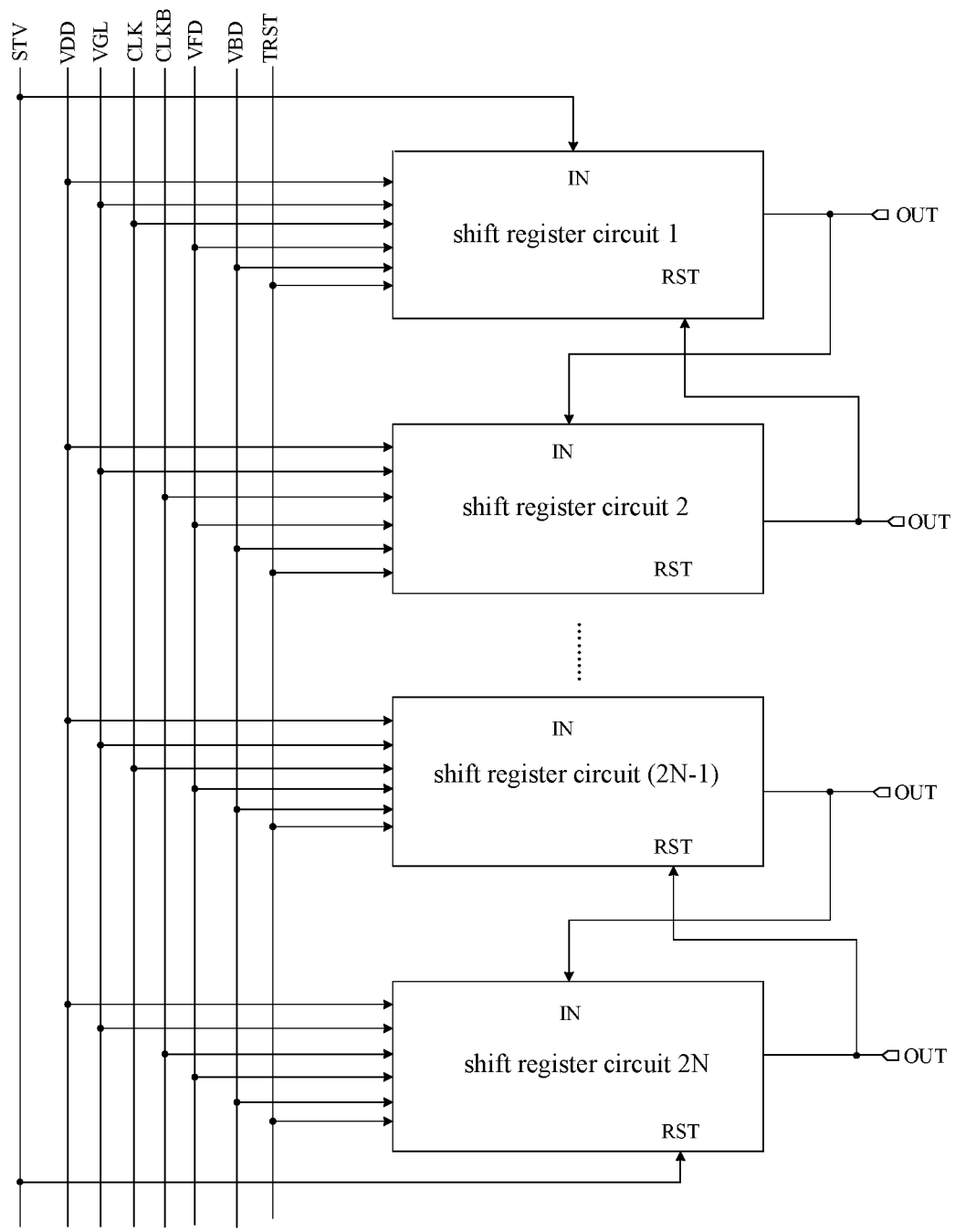
FIG. 12 is a schematic structural diagram of a gate drive circuit according to an embodiment of the present disclosure.

FIG. 12 is a schematic structural diagram of a gate drive circuit according to an embodiment of the present disclosure. As illustrated in FIG. 12, the gate drive circuit may include at least two cascaded shift register circuits. Herein, each shift register circuit may be the shift register circuit as illustrated in any one of FIG. 1 to FIG. 4.

As seen from FIG. 12, the output terminal OUT of each stage of shift register circuit is connected to the reset signal terminal RST of a previous stage of shift register circuit, and the output terminal OUT of each stage of shift register circuit is connected to the input signal terminal IN of the previous stage of shift register circuit. In the gate drive circuit, the input signal terminal IN of the first stage of shift register circuit and the reset signal terminal RST of the last stage of shift register circuit may be connected to a start signal terminal STV.

In the embodiment of the present disclosure, by controlling the first control signal terminal VFD and the second control signal terminal VBD, the shift register circuits in the gate drive circuit implement forward and reverse scanning for a display device.

For example, when the first control signal terminal VFD outputs the first control signal at the first potential, and the second control signal terminal VBD outputs the second control signal at the second potential, the shift register circuits in the gate drive circuit may be started sequentially from the first stage of shift register circuit. In this way, forward scanning of the display device may be implemented. When the first control signal terminal VFD outputs the first control signal at the second potential, and the second control signal terminal VBD outputs the second control signal at the first potential, the shift register circuits in the gate drive circuit may be started sequentially from the last stage of shift register circuit. In this way, reverse scanning of the display device may be implemented.

Optionally, referring to FIG. 12, the gate drive circuit may be connected to two clock signal terminals CLK and CLKB. In addition, adjacent two stages of shift register circuits may be connected to one of these two clock signal terminals respectively. For example, in the circuit as illustrated in FIG. 12, the first stage of shift register circuit is connected to the clock signal terminal CLK, and the second stage of shift register circuit is connected to the clock signal terminal CLKB. The clock signals output by these two clock signal terminals CLK and CLKB have the same frequency but reverse phases.

In addition, an embodiment of the present disclosure further provides a display device. The display device may include the gate drive circuit as illustrated in FIG. 12. The display device may be: a liquid crystal panel, an electronic paper, an OLED panel, an AMOLED panel, a mobile phone, a tablet computer, a TV, a display, a laptop computer, a digital photo frame, a navigator or any other product or part having a display function.

A person skilled in the art would clearly acknowledge that for convenience and conciseness of description, the specific operation processes of the above described gate drive circuit, shift register circuit and sub-circuits may be made reference to the relevant processes in the above described method embodiments, which are not described herein any further.

The foregoing descriptions are only exemplary embodiments of the present disclosure, and are not intended to limit the present disclosure. Within the spirit and principles of the disclosure, any modifications, equivalent substitutions, improvements, etc., are within the protection scope of the appended claims of the present disclosure.

What is claimed is:

1. A shift register circuit, comprising:
an input sub-circuit, an output sub-circuit, a discharge sub-circuit and a noise reduction sub-circuit; wherein
the input sub-circuit is connected to an input signal terminal, a first control signal terminal and a pull-up node respectively, and configured to, under the control of an input signal from the input signal terminal, output a first control signal from the first control signal terminal to the pull-up node;
the output sub-circuit is connected to a clock signal terminal, the pull-up node and an output terminal respectively, and configured to, under the control of the pull-up node, output a clock signal from the clock signal terminal to the output terminal;
the discharge sub-circuit is connected to the input signal terminal, a first power source terminal and a pull-down node respectively, and configured to, under the control of the input signal, output a first power source signal from the first power source terminal to the pull-down node; and
the noise reduction sub-circuit is connected to the pull-down node, the first power source terminal, the pull-up node and the output terminal respectively, and configured to, under the control of the pull-down node, output the first power source signal to the pull-up node and the output terminal respectively;
wherein the shift register circuit further comprises: a reset sub-circuit; wherein
the reset sub-circuit is connected to a reset signal terminal; a second control signal terminal and the pull-up node respectively, and configured to, under the control of a reset signal from the reset signal terminal, output a second control signal from the second control signal terminal to the pull-up node, wherein a potential of the second control signal is a second potential; and
the discharge sub-circuit is further connected to the reset signal terminal, and the discharge sub-circuit is further configured to, under the control of the reset signal, output the first power source signal to the pull-down node;

wherein the discharge sub-circuit comprises: a first transistor and a second transistor; wherein
   a gate of the first transistor is connected to the input signal terminal, a first electrode of the first transistor is connected to the first power source terminal, and a second electrode of the first transistor is connected to the pull-down node; and
   a gate of the second transistor is connected to the reset signal terminal, a first electrode of the second transistor is connected to the first power source terminal, and a second electrode of the second transistor is connected to the pull-down node;
wherein the noise reduction sub-circuit comprises: a ninth transistor and a tenth transistor; wherein
   a gate of the ninth transistor is connected to the pull-down node, a first electrode of the ninth transistor is connected to the first power source terminal, and a second electrode of the ninth transistor is connected to the pull-up node; and
   a gate of the tenth transistor is connected to the pull-down node, a first electrode of the tenth transistor is connected to the first power source terminal, and a second electrode of the tenth transistor is connected to the output terminal;
wherein the input sub-circuit comprises: a third transistor and a fourth transistor; and wherein the reset sub-circuit comprises: a fifth transistor and a sixth transistor; and the noise reduction sub-circuit further comprises: an eleventh transistor and a twelfth transistor; wherein
   a gate of the eleventh transistor is connected to the pull-down node, a first electrode of the eleventh transistor is connected to the first power source terminal, and a second electrode of the eleventh transistor is connected to the second electrode of the third transistor and the first electrode of the fourth transistor respectively; and
   a gate of the twelfth transistor is connected to the pull-down node, a first electrode of the twelfth transistor is connected to the first power source terminal, and a second electrode of the twelfth transistor is connected to the second electrode of the fifth transistor and the first electrode of the sixth transistor respectively; and
wherein a potential of the first control signal is a first potential, a potential of the first power source signal is a second potential, and a potential of the second control signal is the second potential.

2. The shift register circuit according to claim 1, further comprising: a first pull-down control sub-circuit and a second pull-down sub-circuit; wherein
   the first pull-down control sub-circuit is connected to the pull-down node and a second power source terminal, and configured to, under the control of a second power source signal from the second power source terminal, output the second power source signal to the pull-down node, wherein a potential of the second power source signal is a first potential; and
   the second pull-down control sub-circuit is connected to the pull-up node, the pull-down node and the first power source terminal respectively, and configured to, under the control of the pull-up node, output the first power source signal from the first power source terminal to the pull-down node.

3. The shift register circuit according to claim 1, wherein
   a gate of the third transistor is connected to the input signal terminal, a first electrode of the third transistor is connected to the first control signal terminal, and a second electrode of the third transistor is connected to a first node; and
   a gate of the fourth transistor is connected to the input signal terminal, a first electrode of the fourth transistor is connected to the first node, and a second electrode of the fourth transistor is connected to the pull-up node.

4. The shift register circuit according to claim 1, wherein
   a gate of the fifth transistor is connected to the reset signal terminal, a first electrode of the fifth transistor is connected to the second control signal terminal, and a second electrode of the fifth transistor is connected to a second node; and
   a gate of the sixth transistor is connected to the reset signal terminal, a first electrode of the sixth transistor is connected to the second node, and a second electrode of the sixth transistor is connected to the pull-up node.

5. The shift register circuit according to claim 2; wherein the first pull-down control sub-circuit comprises: a seventh transistor; wherein
   a gate and a first electrode of the seventh transistor are connected to the second power source terminal, and a second electrode of the seventh transistor is connected to the pull-down node.

6. The shift register circuit according to claim 2, wherein the second pull-down control sub-circuit comprises: an eighth transistor; wherein
   a gate of the eighth transistor is connected to the pull-up node, a first electrode of the eighth transistor is connected to the first power source terminal, and a second electrode of the eighth transistor is connected to the pull-down node.

7. The shift register circuit according to claim 1, further comprising: a thirteenth transistor; wherein
   a gate of the thirteenth transistor is connected to a general reset signal terminal, a first electrode of the thirteenth transistor is connected to the first power source terminal, and a second electrode of the thirteenth transistor is connected to the pull-up node.

8. The shift register circuit according to claim 7, further comprising: a fourteenth transistor; wherein
   a gate of the fourteenth transistor is connected to the general reset signal terminal, a first electrode of the fourteenth transistor is connected to the first power source terminal, and a second electrode of the fourteenth transistor is connected to the output terminal.

9. The shift register circuit according to claim 1, wherein the output sub-circuit comprises: a fifteenth transistor and a capacitor; wherein
   a gate of the fifteenth transistor is connected to the pull-up node, a first electrode of the fifteenth transistor is connected to the clock signal terminal, and a second electrode of the fifteenth transistor is connected to the output terminal; and
   one terminal of the capacitor is connected to the pull-up node, and the other terminal of the capacitor is connected to the output terminal.

10. A driving method of a shift register circuit, wherein the shift register circuit comprises: an input sub-circuit, an output sub-circuit, a discharge sub-circuit and a noise reduction sub-circuit, wherein the input sub-circuit is connected to an input signal terminal, a first control signal terminal and a pull-up node respectively, the output sub-circuit is connected to a clock signal terminal, the pull-up node and an output terminal respectively, the discharge sub-circuit is connected to the input signal terminal, a first power source terminal and a pull-down node respectively, and the noise reduction sub-circuit is connected to the pull-down node, the first power source terminal, the pull-up node and the output terminal respectively; and the method comprises:

at an input stage, under the control of an input signal provided by the input signal terminal, outputting, by the input sub-circuit, a first control signal from a first control signal terminal to the pull-up node, and outputting, by the discharge sub-circuit, a first power source signal from the first power source terminal to the pull-down node; and at an output stage, under the control of the pull-up node, outputting, by the output sub-circuit, a first clock signal to the output terminal;

wherein the shift register circuit further comprises: a reset sub-circuit; the reset sub-circuit is connected to a reset signal terminal, a second control signal terminal and the pull-up node respectively; and after the output stage, the method further comprises:

at a reset stage, under the control of a reset signal provided by the reset signal terminal, outputting, by the reset sub-circuit, a second control signal from the second control signal terminal to the pull-up node, and outputting, by the discharge sub-circuit, the first power source signal to the pull-down node;

wherein the discharge sub-circuit comprises: a first transistor and a second transistor; wherein a gate of the first transistor is connected to the input signal terminal, a first electrode of the first transistor is connected to the first power source terminal, and a second electrode of the first transistor is connected to the pull-down node; and a gate of the second transistor is connected to the reset signal terminal, a first electrode of the second transistor is connected to the first power source terminal, and a second electrode of the second transistor is connected to the pull-down node;

wherein the noise reduction sub-circuit comprises: a ninth transistor and a tenth transistor; wherein a gate of the ninth transistor is connected to the pull-down node, a first electrode of the ninth transistor is connected to the first power source terminal, and a second electrode of the ninth transistor is connected to the pull-up node; and a gate of the tenth transistor is connected to the pull-down node, a first electrode of the tenth transistor is connected to the first power source terminal, and a second electrode of the tenth transistor is connected to the output terminal;

wherein the input sub-circuit comprises: a third transistor and a fourth transistor; and wherein the reset sub-circuit comprises: a fifth transistor and a sixth transistor; and the noise reduction sub-circuit further comprises: an eleventh transistor and a twelfth transistor; wherein a gate of the eleventh transistor is connected to the pull-down node, a first electrode of the eleventh transistor is connected to the first power source terminal, and a second electrode of the eleventh transistor is connected to the second electrode of the third transistor and the first electrode of the fourth transistor respectively; and a gate of the twelfth transistor is connected to the pull-down node, a first electrode of the twelfth transistor is connected to the first power source terminal, and a second electrode of the twelfth transistor is connected to the second electrode of the fifth transistor and the first electrode of the sixth transistor respectively; and wherein a potential of the first control signal is a first potential, a potential of the first power source signal is a second potential, and a potential of the second control signal is the second potential.

11. The method according to claim 10, wherein the shift register circuit further comprises: a first pull-down control sub-circuit and a second pull-down control sub-circuit, wherein the first pull-down control sub-circuit is connected to the pull-down node and a second power source terminal respectively, and the second pull-down control sub-circuit is connected to the pull-up node, the pull-down node and the first power source terminal respectively;

at the input stage and the output stage, the second pull-down control sub-circuit, under the control of the pull-up node, outputs the first power source signal to the pull-down node; and after the reset stage, the method further comprises:

at a noise reduction stage, under the control of a second power source signal provided by the second power source terminal, outputting, by the first pull-down control sub-circuit, the second power source signal to the pull-down node, and under the control of the pull-down node, outputting, by the noise reduction sub-circuit, the first power source signal to the pull-up node and the output terminal respectively.

12. The method according to claim 11, wherein the shift register circuit further comprises: a thirteenth transistor, wherein a gate of the thirteenth transistor is connected to a general reset signal terminal, a first electrode of the thirteenth transistor is connected to the first power source terminal, and a second electrode of the thirteenth transistor is connected to the pull-up node; and after the noise reduction stage, the method further comprises:

at a general reset stage, turning on the thirteenth transistor under the control of a general reset signal provided by the general reset signal terminal, and outputting by the first power source terminal the first power source signal to the pull-up node via the thirteenth transistor.

13. A gate drive circuit, comprising: at least two cascaded shift register circuits; wherein the shift register circuit comprises: an input sub-circuit, an output sub-circuit, a discharge sub-circuit and a noise reduction sub-circuit; wherein the input sub-circuit is connected to an input signal terminal, a first control signal terminal and a pull-up node respectively, and configured to, under the control of an input signal from the input signal terminal, output a first control signal from the first control signal terminal to the pull-up node;

the output sub-circuit is connected to a dock signal terminal, the pull-up node and an output terminal respectively, and configured to, under the control of the pull-up node, output a dock signal from the clock signal terminal to the output terminal;

the discharge sub-circuit is connected to the input signal terminal, a first power source terminal and a pull-down node respectively, and configured to, under the control of the input signal, output a first power source signal from the first power source terminal to the pull-down node;

the noise reduction sub-circuit is connected to the pull-down node, the first power source terminal, the pull-up node and the output terminal respectively, and configured to, under the control of the pull-down node, output the first power source signal to the pull-up node and the output terminal respectively;

wherein the shift register circuit further comprises: a reset sub-circuit; wherein the reset sub-circuit is connected to a reset signal terminal, a second control signal terminal and the pull-up node respectively, and configured to, under the control of a reset signal from the reset signal terminal, output a second control signal from the second control signal terminal to the pull-up node; and the discharge sub-circuit is further connected to the reset signal terminal, and the discharge sub-circuit is further configured to, under the control of the reset signal, output the first power source signal to the pull-down node;

wherein the discharge sub-circuit comprises: a first transistor and a second transistor; wherein a gate of the first transistor is connected to the input signal terminal, a first electrode of the first transistor is connected to the first power source terminal, and a second electrode of the first transistor is connected to the pull-down node; and a gate of the second transistor is connected to the reset signal terminal, a first electrode of the second transistor is connected to the first power source terminal, and a second electrode of the second transistor is connected to the pull-down node; and wherein a potential of the first control signal is a first potential, a potential of the first power source signal is a second potential, and a potential of the second control signal is the second potential;

wherein the noise reduction sub-circuit comprises: a ninth transistor and a tenth transistor; wherein a gate of the ninth transistor is connected to the pull-down node, a first electrode of the ninth transistor is connected to the first power source terminal, and a second electrode of the ninth transistor is connected to the pull-up node; and a gate of the tenth transistor is connected to the pull-down node, a first electrode of the tenth transistor is connected to the first power source terminal, and a second electrode of the tenth transistor is connected to the output terminal;

wherein the input sub-circuit comprises: a third transistor and a fourth transistor; and wherein the reset sub-circuit comprises: a fifth transistor and a sixth transistor; and the noise reduction sub-circuit further comprises: an eleventh transistor and a twelfth transistor; wherein a gate of the eleventh transistor is connected to the pull-down node, a first electrode of the eleventh transistor is connected to the first power source terminal, and a second electrode of the eleventh transistor is connected to the second electrode of the third transistor and the first electrode of the fourth transistor respectively; and a gate of the twelfth transistor is connected to the pull-down node, a first electrode of the twelfth transistor is connected to the first power source terminal, and a second electrode of the twelfth transistor is connected to the second electrode of the fifth transistor and the first electrode of the sixth transistor respectively;

an output terminal of each stage of shift register circuit is connected to a reset signal terminal of a previous stage of shift register circuit; and an output terminal of each stage of shift register circuit is connected to an input signal terminal of a next stage of shift register circuit.

14. A display device, comprising the gate drive circuit according to claim 13.

* * * * *